(12) United States Patent
Tsukamoto

(10) Patent No.: US 10,818,483 B2
(45) Date of Patent: Oct. 27, 2020

(54) PULSED SPUTTERING APPARATUS AND PULSED SPUTTERING METHOD

(71) Applicant: Ayabo Corporation, Anjo-shi, Aichi (JP)

(72) Inventor: Keizo Tsukamoto, Anjo (JP)

(73) Assignee: AYABO CORPORATION, Anjo-Shi, Aichi (JP)

( * ) Notice: Subject to any disclaimer, the term of this patent is extended or adjusted under 35 U.S.C. 154(b) by 0 days.

(21) Appl. No.: 16/203,259

(22) Filed: Nov. 28, 2018

(65) Prior Publication Data

US 2019/0096642 A1   Mar. 28, 2019

Related U.S. Application Data

(63) Continuation of application No. 14/770,792, filed as application No. PCT/JP2014/053850 on Feb. 19, 2014, now abandoned.

(30) Foreign Application Priority Data

Feb. 28, 2013   (JP) .................................. 2013038798
Nov. 11, 2013   (JP) .................................. 2013232926

(51) Int. Cl.
  *H01J 37/34* (2006.01)
  *H01J 37/32* (2006.01)
  *C23C 14/34* (2006.01)

(52) U.S. Cl.
  CPC ...... *H01J 37/3467* (2013.01); *C23C 14/3485* (2013.01); *C23C 14/3492* (2013.01); *H01J 37/32449* (2013.01)

(58) Field of Classification Search
  CPC ............ C23C 14/3485; C23C 14/3492; C23C 14/0042; C23C 16/45523; H01J 37/32449; H01J 37/3467
  See application file for complete search history.

(56) References Cited

U.S. PATENT DOCUMENTS 6,296,747 B1   10/2001   Tanaka
6,946,408 B2   9/2005    Le et al.
(Continued)

FOREIGN PATENT DOCUMENTS

JP   61-261473 A   11/1986
JP   04-002771 A   1/1992
(Continued)

OTHER PUBLICATIONS

Machine Translation JP61261473A (Year: 1986).*
(Continued)

*Primary Examiner* — Michael A Band
(74) *Attorney, Agent, or Firm* — Yakov Sidorin; Quarles & Brady LLP

(57) ABSTRACT

An object of the invention is to reduce sizes of an inert gas supply and exhaust devices used for a pulse sputtering device. Another object is to efficiently supply suitable quantity of the inert gas to a place where the inert gas is required in the pulse sputtering device. Therefore, a provided pulse sputtering device has a sputtering source that performs pulse discharge and generates plasma, a gas injection valve that injects and supplies an inert gas to the sputtering source and a controller that controls the sputtering source and the gas injection valve. The controller controls the sputtering source and the gas injection valve such that the gas injection valve injects the inert gas intermittently and such that a part of a period, in which the pulse discharge occurs in the sputtering source, overlaps with a part of a period, in which the gas injection valve injects and supplies the inert gas.

5 Claims, 12 Drawing Sheets

(56) References Cited

U.S. PATENT DOCUMENTS

| | | | |
|---|---|---|---|
| 8,435,389 B2 | 5/2013 | Kadlec et al. | |
| 8,597,473 B1 * | 12/2013 | Onishi | C23C 14/0042 |
| | | | 204/192.12 |
| 2005/0173240 A1 | 8/2005 | Hibara | |
| 2008/0135400 A1 | 6/2008 | Kadlec et al. | |
| 2008/0135401 A1 | 6/2008 | Kadlec et al. | |
| 2008/0308416 A1 | 12/2008 | Allen et al. | |
| 2013/0220802 A1 | 8/2013 | Weichart et al. | |

FOREIGN PATENT DOCUMENTS

| | | |
|---|---|---|
| JP | 2003-247064 A | 9/2003 |
| JP | 2010-512458 A | 4/2010 |
| JP | 2010-512459 A | 4/2010 |
| JP | 2012-099226 A | 5/2012 |

OTHER PUBLICATIONS

International Search Report PCTJP2014053850 with English translation.

Written Opinion PCTJP2014053850 with partial English translation.

\* cited by examiner

PULSED SPUTTERING APPARATUS AND PULSED SPUTTERING METHOD

TECHNICAL FIELD

The present invention relates to a pulse sputtering device and a pulse sputtering method.

BACKGROUND TECHNOLOGY

The sputtering method is one of physical vapor deposition methods. In the sputtering method, a high voltage is applied while introducing an inert gas (e.g., argon gas) into a vacuum vessel. The inert gas ionized in a glow discharge, which is caused by the applying the voltage, i.e., plasma, is made to collide with a target as a film-forming material. A target ingredient sputtered by an impact of the collision is deposited on a work as a film-forming object, thereby forming a film. The sputtering method includes a pulse sputtering method that uses a pulsed sputtering power as a sputtering power supplied to the target constituting a cathode.

PRIOR ART DOCUMENTS

Patent Document

[Patent document 1] JP-A-2010-512458
[Patent document 2] JP-A-2010-512459

SUMMARY OF INVENTION

Problems to be Solved by Invention

When performing the pulse sputtering, concentration of the inert gas in the vacuum vessel accommodating the target is maintained substantially constant. Therefore, conventionally and generally, the inert gas is constantly supplied into the vacuum vessel at a predetermined flow rate and the inert gas is constantly exhausted from the vacuum vessel at a predetermined flow rate.

However, the construction that continuously supplies and exhausts the inert gas in this way can cause increase in quantity of the used inert gas and sizes of devices for supplying and exhausting the inert gas as a result.

Furthermore, the conventional construction merely provides substantially uniform concentration of the inert gas in the entire space of the vacuum vessel. It has been difficult for the conventional device to optimize the concentration of the inert gas on a surface of the cathode where the inert gas is actually used for generating the plasma, i.e., on a sputtering surface. Specifically, it has been difficult for the conventional construction to provide high concentration of the inert gas there.

Therefore, it is an object of the present invention to reduce sizes of devices for supplying and exhausting an inert gas by reducing quantity of the inert gas used in a pulse sputtering device. It is another object of the present invention to efficiently supply suitable quantity of the inert gas at suitable timing to a space where the inert gas is actually used for generating plasma in the pulse sputtering device.

Means for Solving Problems

The inventors of the present invention conducted many studies with enthusiasm to solve the above problems and eventually reached following aspects of the invention.

According to a first aspect of the present invention, a pulse sputtering device has a sputtering source that performs pulse discharge and generates plasma, a gas injection valve that injects and supplies an inert gas to the sputtering source and a controller that controls the sputtering source and the gas injection valve. The controller controls the sputtering source and the gas injection valve such that the gas injection valve injects the inert gas intermittently and such that a part of a period, in which the pulse discharge occurs in the sputtering source, overlaps with a part of a period, in which the gas injection valve injects and supplies the inert gas.

With the above construction, the inert gas is injected and supplied intermittently using the gas injection valve. Accordingly, the quantity of the used inert gas can be reduced as compared with the case where the inert gas is supplied continuously. As a result, the sizes of the devices for supplying and exhausting the inert gas can be reduced. With the above construction, the controller controls the sputtering source and the gas injection valve such that a part of a period, in which the pulse discharge occurs in the sputtering source, overlaps with a part of a period, in which the gas injection valve injects and supplies the inert gas. With such the construction, even if the injection supply of the inert gas is intermittent, generation of the plasma based on the inert gas can be caused surely.

According to a second aspect of the present invention, a pulse sputtering device has a sputtering source that performs pulse discharge and generates plasma, a gas injection valve that injects and supplies an inert gas to the sputtering source and a controller that controls the sputtering source and the gas injection valve. The controller controls the sputtering source and the gas injection valve such that the gas injection valve injects the inert gas intermittently and such that a period, in which the pulse discharge occurs in the sputtering source, is included in a period, in which the gas injection valve injects and supplies the inert gas.

With such the construction, even if the injection supply of the inert gas is intermittent, sufficient quantity of the inert gas can be supplied to the sputtering source at timing when the pulse discharge is performed. Thus, generation of the plasma based on the inert gas can be surely caused.

According to a third aspect of the present invention, in the above pulse sputtering device, the controller supplies power to the gas injection valve according to the injection signal, which is a pulsed electric signal, thereby driving the gas injection valve to inject the inert gas.

With such the construction, the injection supply of the inert gas can be performed intermittently using the gas injection valve.

In this case, the controller may construct the injection signal with a group of multiple pulse signals according to a fourth aspect of the present invention.

According to a fifth or sixth aspect of the present invention, the controller controls the group of multiple pulse signals to vary injection quantity of the inert gas per unit time in an injection period from a start to an end of the injection of the inert gas during the injection period.

With such the construction, for instance, the controller can set injection quantity of the inert gas per unit time in a predetermined period in an early stage of the injection period to be larger than injection quantity of the inert gas per unit time in a period after the predetermined period in the injection period according to a seventh aspect of the present invention. The inert gas has an important role as a trigger of the sputtering. Therefore, in this case, sputtering efficiency can be improved and efficiency of use of the inert gas can be improved further.

According to an eighth aspect of the present invention, the controller varies voltage values, current values or frequency of the multiple pulse signals of the group of the multiple pulse signals constituting the injection signal. Also with such the construction, the above mentioned control of the group of the multiple pulse signals can be realized.

According to a ninth aspect of the present invention, the sputtering source has a target as a cathode, and the gas injection valve injects the inert gas such that at least a part of the injected inert gas has a motion component, which is directed to be perpendicular to a sputtering surface of the target and is directed toward the sputtering surface.

With such the construction, the inert gas can be injected and supplied such that the inert gas is directed toward the sputtering surface of the cathode, which is a target area of the inert gas supply. In this way, the inert gas can be supplied efficiently to the space where the inert gas is actually used for generating the plasma. As a result, concentration of the inert gas supplied to the space can be heightened.

In this case, the gas injection valve may inject the inert gas toward the target (tenth aspect). Alternatively, the gas injection valve may inject the inert gas from a space between an anode and the target of the sputtering source (eleventh aspect). Alternatively, the gas injection valve may inject the inert gas from a part of the anode near the target through an inside of the anode (twelfth aspect).

Also with any of these constructions, the inert gas can be supplied efficiently to the space where the inert gas is actually used for generating the plasma. In addition to the construction that the inert gas is injected directly from an injection hole of the gas injection valve, a construction that the inert gas is injected from an injection hole at a tip of a gas injection pipe extending from the injection hole of the gas injection valve may be used.

According to a thirteenth aspect of the present invention, in the pulse sputtering device as in the eleventh or twelfth aspect, the anode has an opening near the target and a baffle extending from a periphery of the opening. The baffle is arranged at a position where the inert gas injected from the gas injection valve collides with the baffle.

With such the construction, the injected argon gas can be bounced by an inner peripheral surface of the baffle toward the sputtering surface of the target. Thus, the argon gas injected from the gas injection valve stays near the sputtering surface of the target at high concentration, whereby the efficiency of use of the argon gas improves.

EXAMPLE EMBODIMENTS OF INVENTION

First Embodiment

Figure 1A:
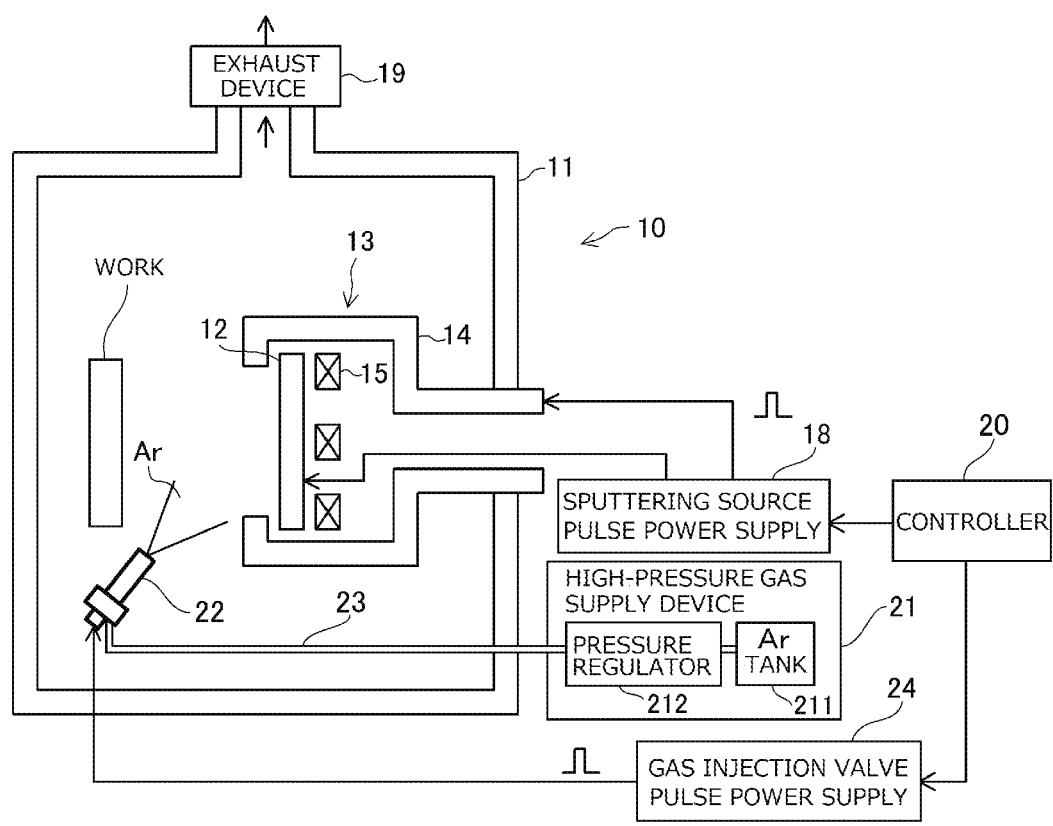
FIG. 1A is a diagram illustrating an outline of a pulse sputtering device according to a first embodiment of the present invention.
Figure 1B:
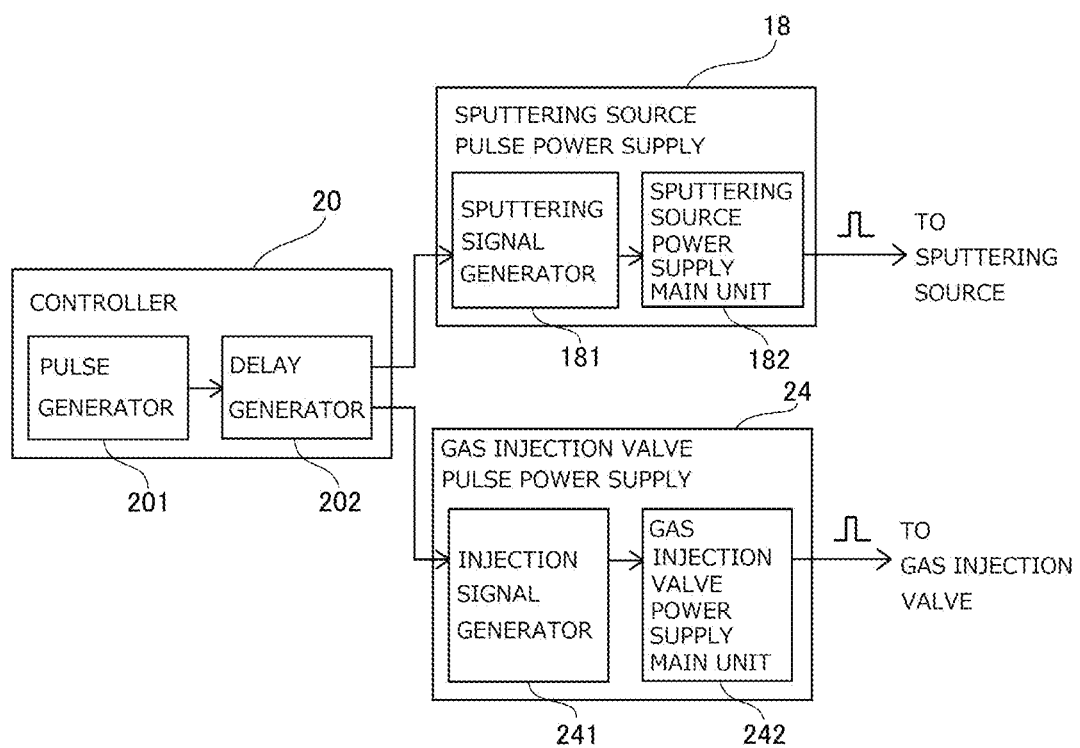
FIG. 1B is a block diagram showing a construction of a control system of the pulse sputtering device according to the first embodiment.

Hereinafter, a pulse sputtering device according to a first embodiment of the present invention will be explained. FIG. 1A is a diagram illustrating an outline of a construction of the pulse sputtering device 10 according to the first embodiment. FIG. 1B is a block diagram schematically showing a construction of a control system (controller) of the pulse sputtering device 10 according to the first embodiment. The pulse sputtering device 10 according to the present embodiment can be used to perform sputtering deposition to a work using pulse sputtering.

The pulse sputtering device 10 has a chamber 11, a sputtering source 13 (magnetron sputtering source in example shown in FIG. 1A), a sputtering source pulse power supply 18, an exhaust device 19, a control device 20, a gas injection valve 22, a gas supply pipe 23 and a gas injection valve pulse power supply 24. An inside of the chamber 11 is exhausted by the exhaust device 19, which is composed of a turbo molecular pump and the like, to a predetermined degree of vacuum (for example, $10^{-2}$ to $10^{-4}$ Pa). The gas injection valve 22 is arranged in the chamber 11. The gas injection valve 22 is constructed such that it is supplied with a pulsed power from the gas injection valve pulse power supply 24 and it can perform intermittent injection supply of an argon gas (Ar gas) inside the chamber 11. A high-pressure gas supply device 21 shown in FIG. 1A supplies the argon gas as an inert gas to the gas injection valve 22 through the gas supply pipe 23 and consists of an argon gas tank 211 for storing the argon gas, a pressure regulator 212 and the like.

The sputtering source 13 consists of a target 12, an anode 14 and a magnet unit 15. The target 12 as a cathode is connected to the sputtering source pulse power supply 18. The sputtering source 13 is arranged in the chamber 11. If the inside of the chamber 11 is vacuumed, the argon gas is supplied from the gas injection valve 22 and the pulse power is supplied from the sputtering source pulse power supply 18 (i.e., high-voltage pulse is applied between target 12 and anode 14), a glow discharge arises between the target 12 and the anode 14. Moreover, the pulse sputtering device 10 according to the present embodiment can perform magnetron sputtering by applying a magnetic field near a surface of the target 12 with the magnet unit 15, thereby generating a more intense glow discharge. It should be noted that the magnetron sputtering is not an indispensable element of the present invention and that the present invention may be implemented without using the magnet unit 15.

In this embodiment, a tip portion as an injection side end of the gas injection valve 22 is directed toward the target 12. The argon gas injected from the gas injection valve 22 is injected substantially in a conical shape that becomes wider with distance from an injection hole at the tip of the gas injection valve 22. Thus, the gas injection valve 22 is constructed such that it can inject the argon gas toward the target 12 and can inject the argon gas to a wide area of the target 12 substantially uniformly. Directing the tip portion of the gas injection valve 22 toward the target 12 is not indispensable requirement as long as the injection hole of the gas injection valve 22 is constructed so that the argon gas can be injected in this way.

In the case where the argon gas is injected with a predetermined distribution in a cross-section of the gas stream from the gas injection valve 22, it is desirable that a straight line passing through the center of the injection hole of the gas injection valve 22 and the centroid of the distribution crosses the target 12 when performing the above-mentioned injection. The position where the straight line passing through the centroid crosses the target 12 should be preferably the center or the centroid of the target 12.

The gas injection valve 22 may have a single injection hole or multiple injection holes. In the case where the gas injection valve 22 has the multiple injection holes and where the argon gas injected from each of the respective injection holes has a predetermined distribution in the cross-section of the gas stream, it is suitable that a straight line passing through the center of each of the respective injection holes and the centroid of the distribution overlaps with each of respective erosion areas on the sputtering surface of the target 12. The erosion area is an area on the sputtering surface of the target 12 where erosion is specifically promoted by an influence of the magnetic field applied by the magnet unit 15.

An automotive fuel injection valve (for example, injector for diesel engine) can be used as the gas injection valve 22, for instance. As for classification by a drive system of the valve, a magnetic valve or a piezo valve may be used. Any fuel injection valve of any system may be used if it can perform drive described below.

When performing the sputtering deposition, the work as the object of the sputtering deposition is arranged in a predetermined position in the chamber 11 and is opposed to the target 12. In this case, the position for arranging the gas injection valve 22 should be preferably outside a space A, which is shown by a hatched area A in FIG. 2A. That is, a space that extends from an entirety of a part of the sputtering surface of the target 12, the part not being covered by the anode 14 when the target 12 is seen from the front side (from left side in FIG. 2A), in a direction perpendicular to the sputtering surface is the space A. In the case where the entire sputtering surface of the target 12 does not overlap with the anode 14 when the target 12 is seen from the front side as shown in FIG. 2B, a space that extends from the entire sputtering surface of the target 12 perpendicularly to the sputtering surface serves as the space A.

Figure 2A:
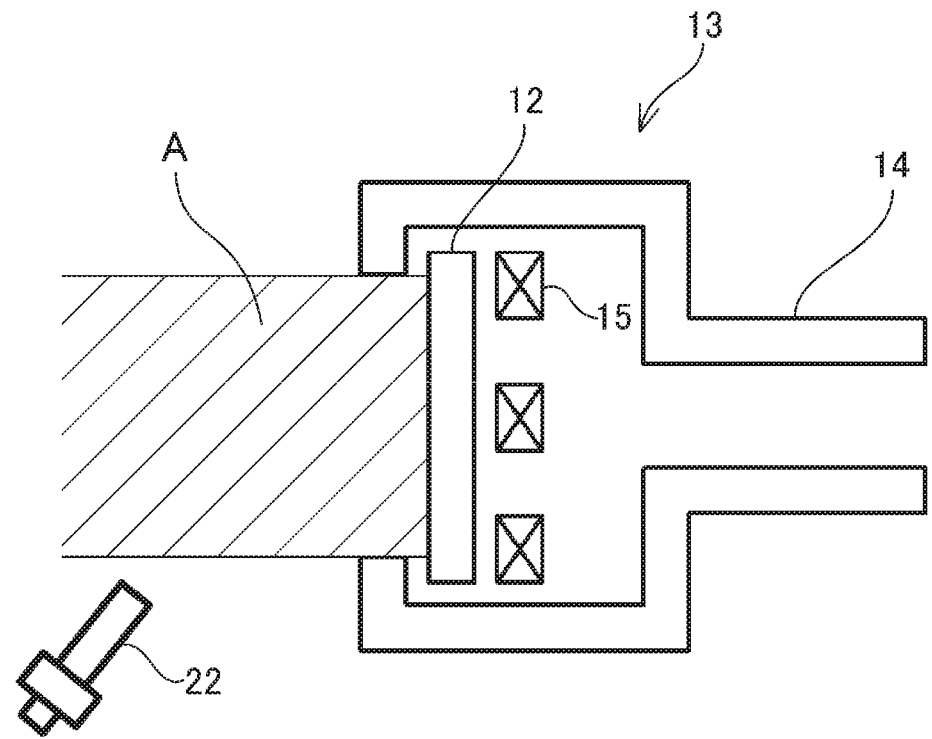
FIGS. 2A and 2B are diagrams illustrating arrangement methods of a gas injection valve according to the first embodiment.
Figure 2B:
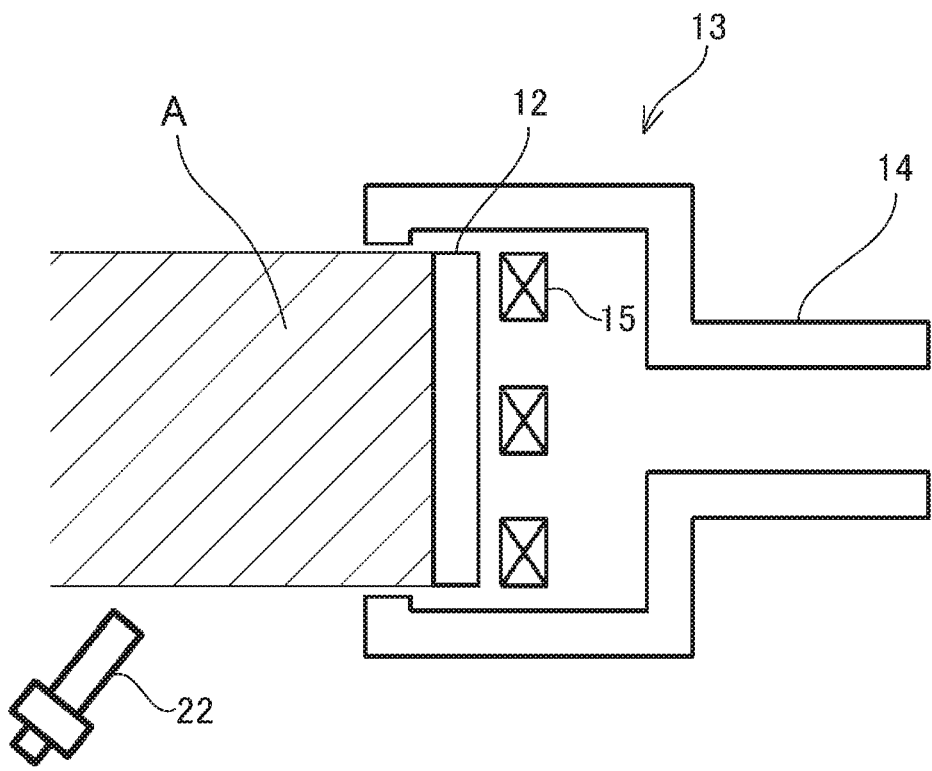

It is thought that concentrations of metal particles and metal ions sputtered from the target 12 are specifically high inside the space A shown in FIG. 2A or 2B. Therefore, if the gas injection valve 22 is arranged in the space A, deposition of the metal to the injection hole of the gas injection valve 22 is promoted, and there is a possibility that the injection hole is blocked in an early stage. Therefore, it is preferable that the gas injection valve 22 is arranged outside the space A.

Next, the control system and a control method of the pulse sputtering device 10 will be explained. The control system of the pulse sputtering device 10 is constructed by the control device 20, the sputtering source pulse power supply 18 and the gas injection valve pulse power supply 24 as shown in FIG. 1B. The control device 20 has a pulse generator 201 and a delay generator 202. The sputtering source pulse power supply 18 has a sputtering signal generator 181 and a sputtering source power supply main unit 182. The gas injection valve pulse power supply 24 has an injection signal generator 241 and a gas injection valve power supply main unit 242.

For instance, the pulse generator 201 generates a pulsed clock signal and sends the signal to the delay generator 202 when performing the sputtering deposition. The delay generator 202 is a multi-channel delay unit and generates a first delay signal having a first delay based on the clock signal and a second delay signal having a second delay different from the first delay. The delay generator 202 sends the first delay signal to the sputtering source pulse power supply 18 and sends the second delay signal to the gas injection valve pulse power supply 24.

If the sputtering signal generator 181 of the sputtering source pulse power supply 18 receives the first delay signal, it generates a pulsed sputtering signal and sends the sputtering signal to the sputtering source power supply main unit 182. The sputtering source power supply main unit 182 applies a pulsed high voltage (for instance, pulse voltage: approximately 1 kV, pulse width: approximately 10 microseconds to 1 millisecond, duty ratio: 50% or lower) to the sputtering source 13 while the sputtering signal is ON.

If the injection signal generator 241 of the gas injection valve pulse power supply 24 receives the second delay signal, it generates a pulsed injection signal and sends the injection signal to the gas injection valve power supply main unit 242. The gas injection valve power supply main unit 242 supplies pulsed power to the gas injection valve 22 according to the injection signal (for instance, it applies voltage to gas injection valve 22 while injection signal is ON).

In this way, the argon gas is supplied to the vicinity of the metallic target 12 from the gas injection valve 22, and the pulse discharge arises in the sputtering source 13, whereby pulsed plasma resulting from the argon gas is formed. Then, neutral particles and ions (univalent ions and multivalent ions) of the metal as the material forming the metallic target 12 are sputtered from the target 12 by the argon ion particles. A desired metal film can be formed on the surface of the work by depositing the metal neutral particles and the metal ions on the work.

Figure 3:
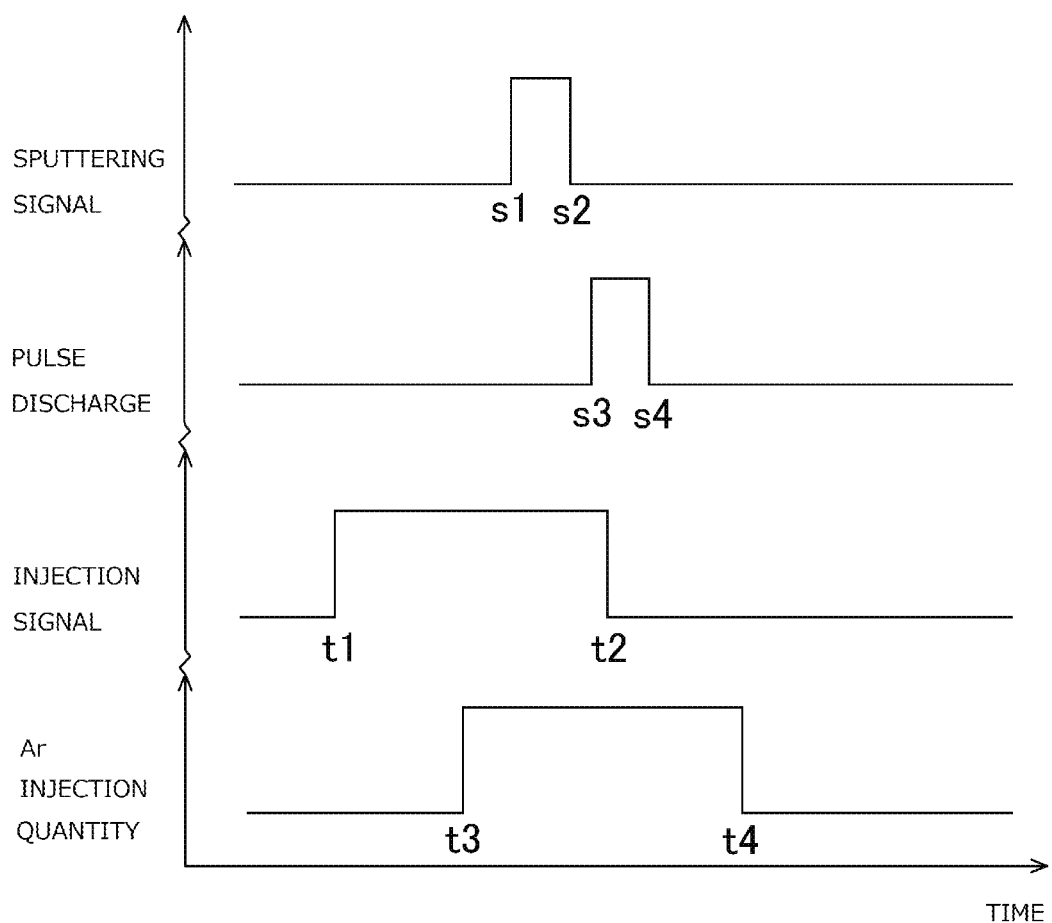
FIG. 3 is a diagram illustrating a control method of the pulse sputtering device according to the first embodiment.

Next, with reference to FIG. 3, pulse discharge control and inert gas supply control using the control system consisting of the control device 20, the sputtering source pulse power supply 18 and the gas injection valve pulse power supply 24 will be explained. In the example shown in FIG. 3, if the sputtering signal is emitted at time s1, the pulse discharge occurs in the sputtering source 13 at time s3 when a delay, which differs among the systems, passes. For instance, pulse width of the sputtering signal (time s1 to s2) is approximately 1.5 milliseconds, and a duration of the pulse discharge (time s3 to s4) is approximately 1 millisecond. Repetition frequency of the sputtering signal is 100 Hz, for instance.

If the injection signal is emitted at time t1, an actuator of the gas injection valve 22 starts driving. Thus, the injection of the argon gas from the gas injection hole of the gas injection valve 22 starts at time t3 when a delay passes after the time t1.

If the injection signal becomes OFF at time t2, the injection of the argon gas ends at time t4 when a delay passes. An injection duration (time t3 to t4) of the argon gas is approximately 5 milliseconds, for instance.

In the series of operations, the delay generator 202 suitably controls the transmission start time s1 of the sputtering signal and the transmission start time t1 of the injection signal with the first and second delay signals, the sputtering signal generator 181 suitably controls the transmission end time s2 of the sputtering signal (or duration of sputtering signal), and the injection signal generator 241 suitably controls the transmission end time t2 of the injection signal (or duration of injection signal) such that the entirety of the period s3 to s4, in which the pulse discharge actually occurs, is included in the period t3 to t4, in which the argon gas is actually injected.

With such the construction, while the supply quantity of the argon gas can be reduced significantly from the case where the argon gas is supplied continuously, necessary quantity of the argon gas can be surely supplied during the period, in which the argon gas is actually used, that is, the period from timing immediately before the period, in which the pulse discharge occurs, to timing immediately after the period, in which the pulse discharge occurs.

It is desirable to suitably set the delays of the first and second delay signals such that a predetermined delay (for instance, approximately 0.5 to 2 milliseconds, or more preferably approximately 1 millisecond or longer) is set from the time t3 when the injection of the argon gas is actually started to the time t3 when the pulse discharge is actually started. Thus, the pulse discharge can be caused in the state where the sufficient quantity of the argon gas for the sputtering is supplied to the target 12.

It is desirable to set a predetermined delay (for instance, approximately 0.5 to 2 milliseconds, more preferably approximately 1 millisecond or longer) from the time s4 when the actual pulse discharge ends to the time t4 when the actual injection of the argon gas ends. Thus, the injection of the argon gas can be continued until the time after the completion of the sputtering. In this way, blockage of the injection hole of the gas injection valve 22 due to the deposition of the sputtered particles (metal particles) can be inhibited by the flow of the argon gas, which spouts continuously from the injection hole of the gas injection valve 22.

In order to obtain a sufficient effect of reducing the sizes of the devices for supplying and exhausting the argon gas through the intermittent supply of the argon gas, it is desirable to set a duty ratio of the gas injection valve 22 (i.e., ratio of time when gas injection valve 22 actually performs injection) at 50% or lower.

Second Embodiment

Figure 4:
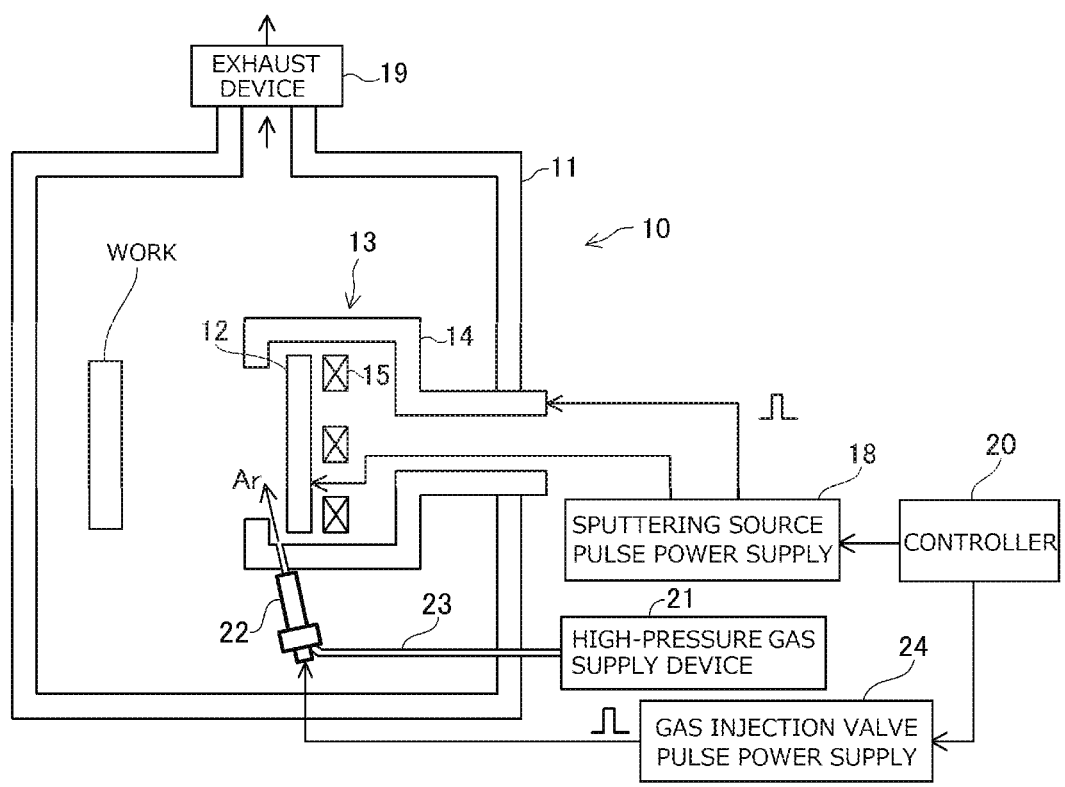
FIG. 4 is a diagram illustrating an outline of a pulse sputtering device according to a second embodiment of the present invention.

FIG. 4 shows an outline of a pulse sputtering device 10 according to a second embodiment of the present invention. In this embodiment, the gas injection valve 22 is arranged on an outer periphery of the anode 14. The argon gas injected from the gas injection valve 22 passes through a passage penetrating through the anode 14 and spouts from a space between the target 12 and the anode 14. Also with such the construction, the argon gas is injected to widen with a predetermined angle, so at least a part of the injected argon gas is supplied toward the target 12. Accordingly, effects similar to the effects of the first embodiment can be exerted by performing control similar to the control of the first embodiment (refer to FIG. 3).

Third Embodiment

Figure 5:
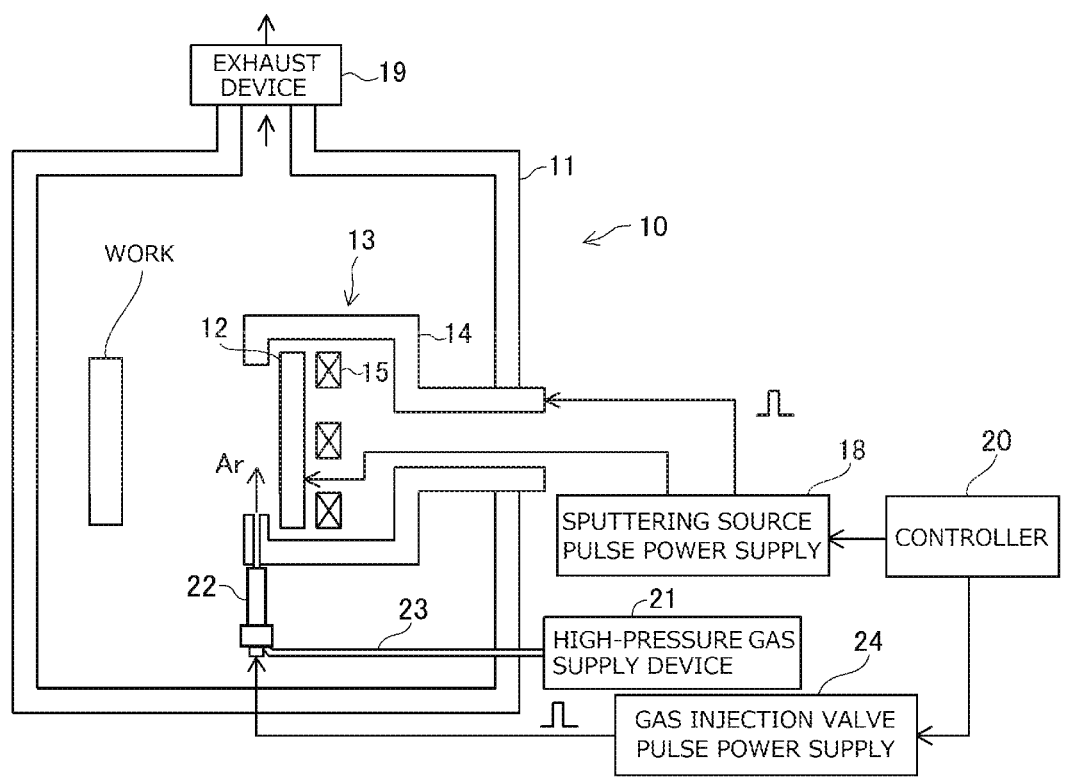
FIG. 5 is a diagram illustrating an outline of a pulse sputtering device according to a third embodiment of the present invention.

FIG. 5 shows an outline of a pulse sputtering device 10 according to a third embodiment of the present invention. In this embodiment, the gas injection valve 22 is arranged on the outer periphery of the anode 14. The argon gas injected from the gas injection valve 22 passes through a passage penetrating through the anode 14 and spouts from a part of an inner peripheral surface of an opening of the anode 14 on the target 12 side substantially in parallel with the target 12. Also with such the construction, the argon gas is injected to widen with a predetermined angle, so at least a part of the injected argon gas is supplied toward the target 12. Accordingly, effects similar to the effects of the first embodiment can be exerted by performing control similar to the control of the first embodiment (refer to FIG. 3).

Fourth to Sixth Embodiments

Figure 6:
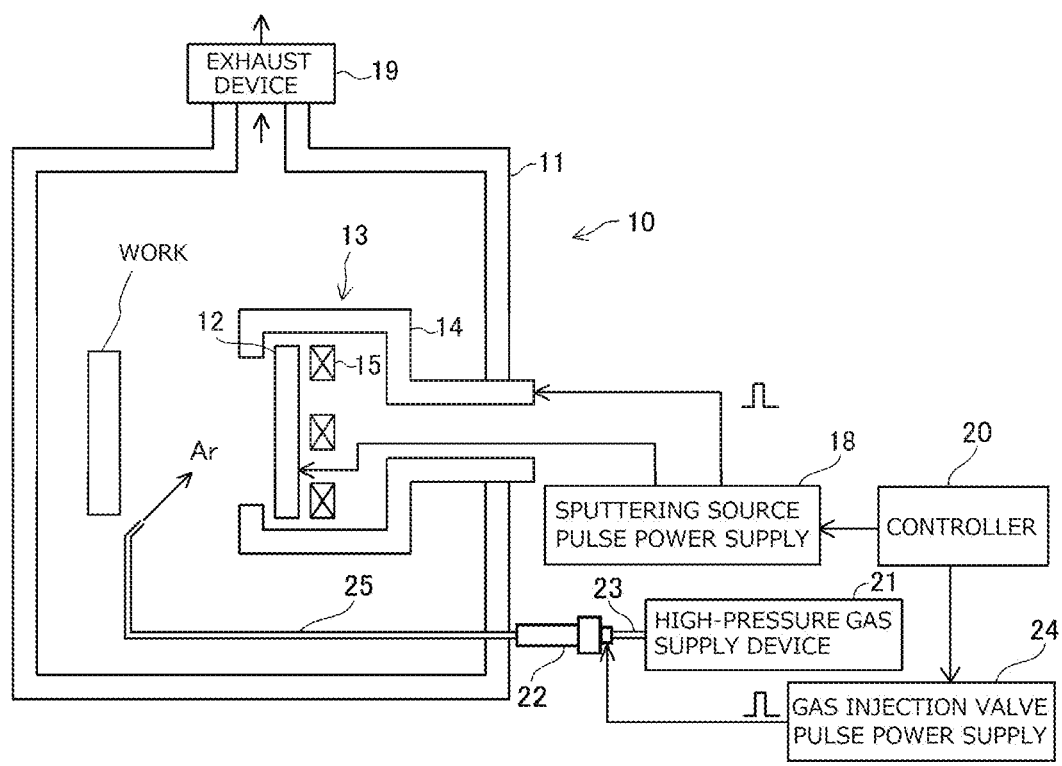
FIG. 6 is a diagram illustrating an outline of a pulse sputtering device according to a fourth embodiment of the present invention.
Figure 7:
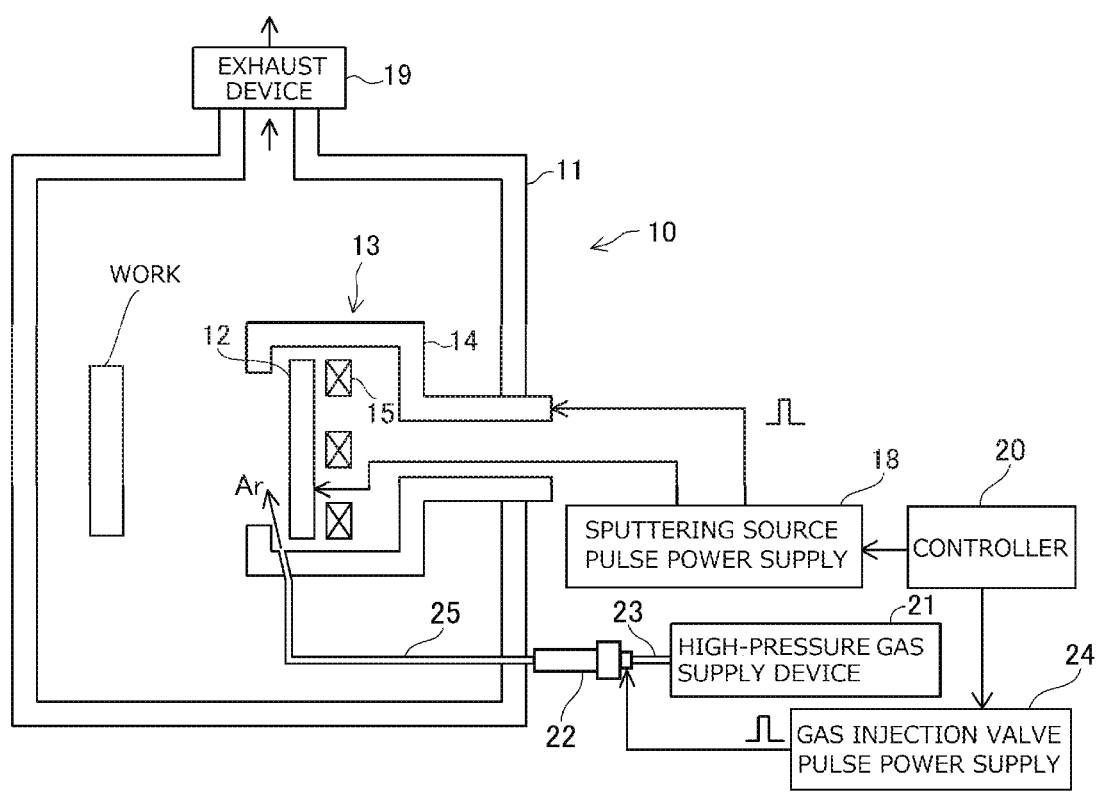
FIG. 7 is a diagram illustrating an outline of a pulse sputtering device according to a fifth embodiment of the present invention.
Figure 8:
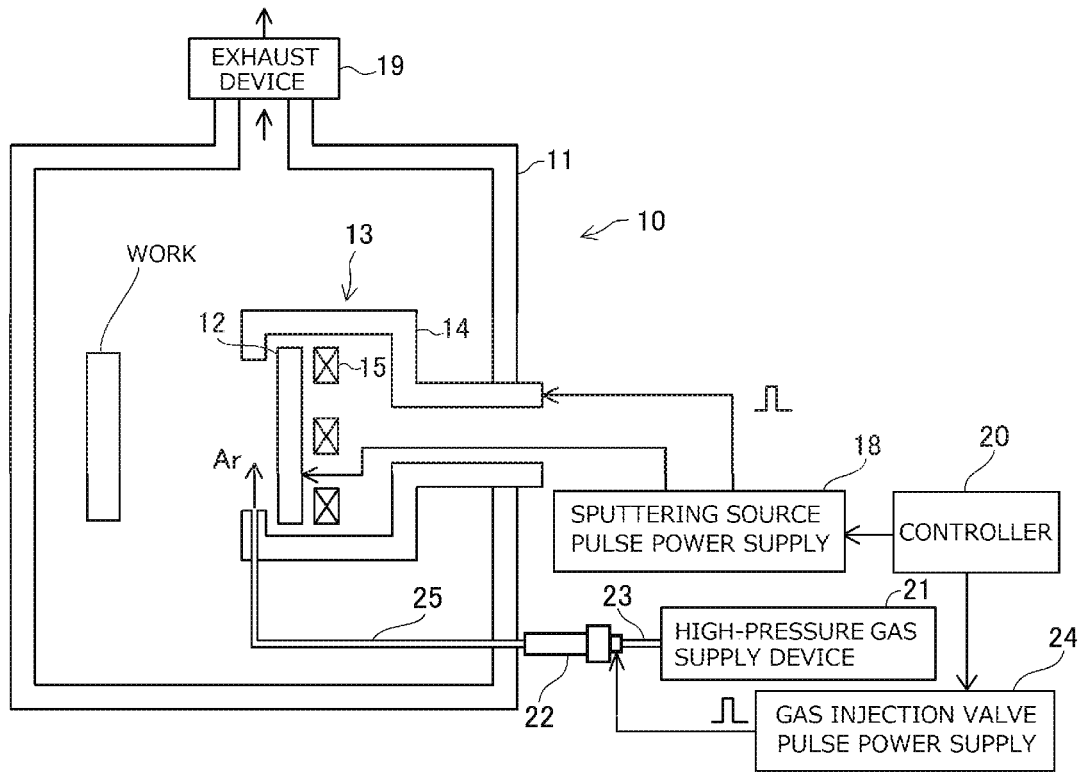
FIG. 8 is a diagram illustrating an outline of a pulse sputtering device according to a sixth embodiment of the present invention.

In the first to third embodiments, the gas injection valve 22 is arranged inside the chamber 11. Alternatively, as shown in FIGS. 6 to 8, the gas injection valve 22 may be arranged outside the chamber 11, and the argon has may be injected toward the target 12 from the gas injection valve 22 through a gas injection pipe 25 (FIG. 6: fourth embodiment). Alternatively, the argon gas may be injected from a space between the target 12 and the anode 14 through a gas injection pipe 25 (FIG. 7: fifth embodiment). Alternatively, the argon gas may be injected from a part of the inner peripheral surface of the anode 14 on the target 12 side through a gas injection pipe 25 (FIG. 8: sixth embodiment). Also in these cases, the argon gas spouts from the injection hole of the gas injection pipe 25 and widens gradually (not shown in drawings). With such the constructions, effects similar to the above-mentioned effects of the first to third embodiments can be exerted. However, response of the argon gas supply can lower depending on the length of the gas injection pipe 25 in these cases.

Seventh Embodiment

Hereinafter, a pulse sputtering device 10 according to a seventh embodiment of the present invention will be explained with reference to FIG. 9. The gas injection valve pulse power supply 24 of this embodiment uses a micro pulse generator as the injection signal generator 241. The control system (specifically, injection signal generator 241) of this embodiment performs control shown in FIG. 9 as signal control of the gas injection valve 22 instead of the control shown in FIG. 3. As a device construction of the pulse sputtering device 10 of this embodiment, any one of constructions according to the first to sixth embodiments can be used.

Figure 9:
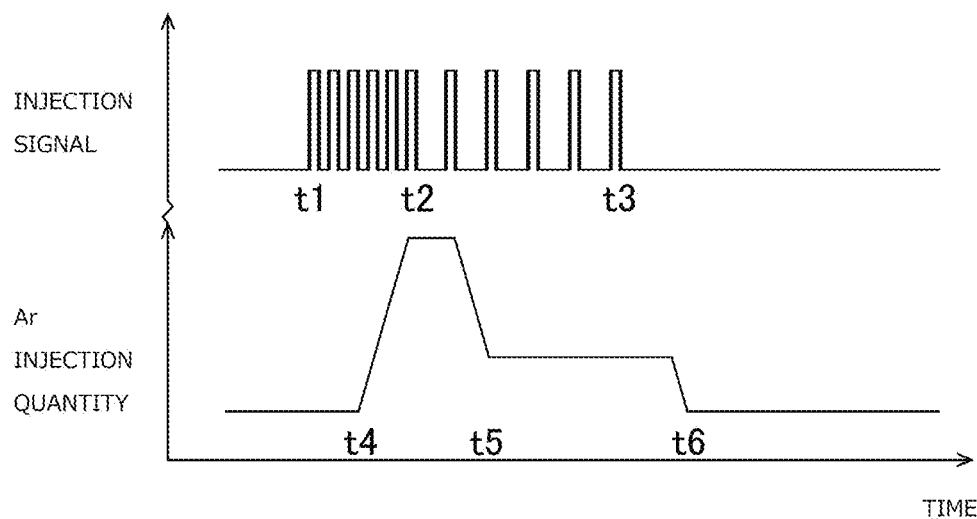
FIG. 9 is a diagram illustrating a control method of a pulse sputtering device according to a seventh embodiment of the present invention.

The injection signal generator 241 of this embodiment is the micro pulse generator as mentioned above and is constructed to be able to emit a signal group consisting of multiple micro pulse signals as an injection signal as shown in FIG. 9. Pulse width of each micro pulse signal is approximately 10 microseconds. The multiple micro pulse signals are emitted successively to emit the injection signal as the signal group lasting for a period of approximately 200 microseconds to approximately 1 millisecond as a whole. The gas injection valve power supply main unit 242 supplies power to the gas injection valve 22 according to the received injection signal.

With such the construction, the injection quantity of the argon gas per unit time (hereafter, referred to as argon gas injection rate) can be varied during one injection period of the argon gas by controlling the respective micro pulse signals. In the example of FIG. 9, frequency of the micro pulse signals is set relatively high during a period t1 to t2, and the frequency of the micro pulse signals during a period t2 to t3 is set relatively low. Thus, the actual argon gas injection rate takes a relatively large value in a period t4 to t5, which is an injection early stage, and then takes a relatively small value in a following period t5 to t6 until the end of the injection. Thus, relatively large quantity of the argon gas is injected in the early stage of the injection. Such the injection mode is desirable because the argon gas has an important role as a trigger of the sputtering. The embodiment is not limited to varying the frequency of the micro pulse signals but may vary voltage values and/or current values of the micro pulse signals. In that case, the gas injection valve power supply main unit 242 should be preferably able to vary the power supplied to the gas injection valve 22 according to the voltage value and/or current value of the injection signal. Moreover, the sputtering signal generator 181 may be constructed with a micro pulse generator like the injection signal generator 241.

Eighth Embodiment

Hereinafter, a pulse sputtering device 10 according to an eighth embodiment of the present invention will be explained with reference to FIG. 10.

Figure 10:
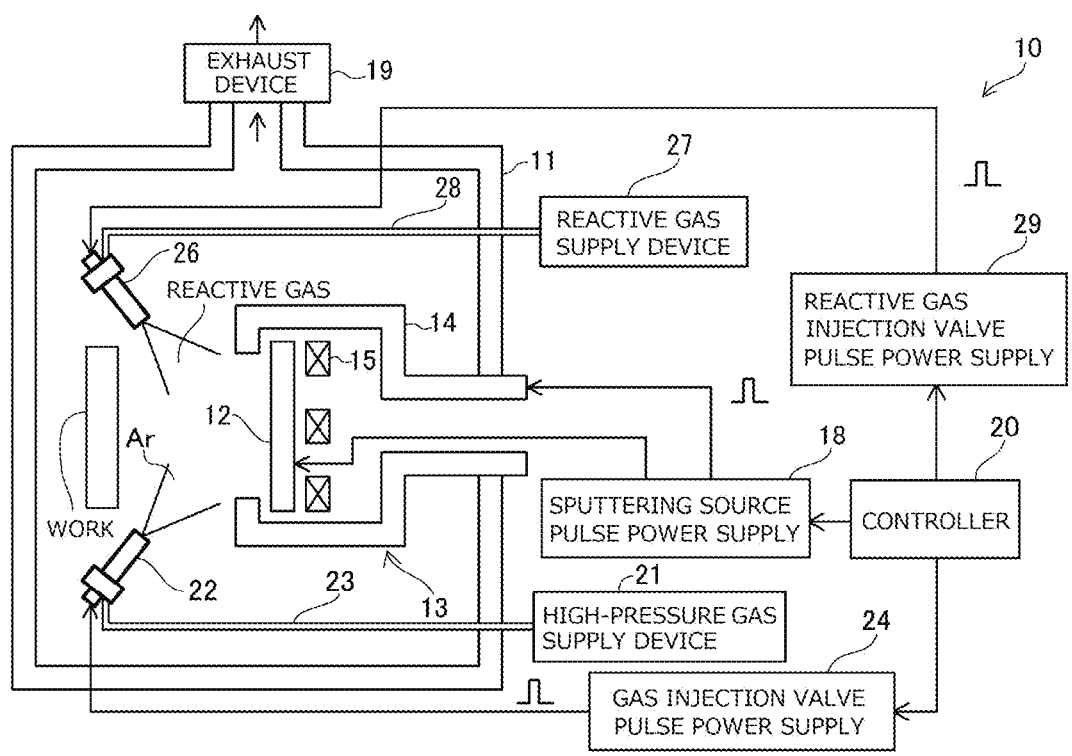
FIG. 10 is a diagram illustrating an outline of a pulse sputtering device according to an eighth embodiment of the present invention.

As shown in FIG. 10, the pulse sputtering device 10 of this embodiment has a reactive gas injection valve 26 for supplying a reactive gas such as nitrogen or oxygen in addition to the gas injection valve 22 for supplying the argon gas. The reactive gas injection valve 26 is arranged inside the chamber 11 like the gas injection valve 22 in the similar manner to the gas injection valve 22 of the first embodiment. The reactive gas injection valve 26 receives supply of the reactive gas from a reactive gas supply unit 27, which is arranged outside the chamber 11, through a reactive gas supply pipe 28. The reactive gas supply unit 27 consists of a reactive gas tank storing the reactive gas (not shown), a pressure regulator (not shown) and the like.

A control system of this embodiment has a reactive gas injection valve pulse power supply 29 in addition to the construction of the control system of any one of the above-mentioned embodiments. The delay generator 202 of the control device 20 sends a third delay signal, which has a predetermined delay, to the reactive gas injection valve pulse power supply 29. The reactive gas injection valve pulse power supply 29 supplies pulse power to the reactive gas injection valve 26 based on the received third delay signal. Thus, the reactive gas injection valve 26 injects the reactive gas in the chamber 11 intermittently.

In this case, it is suitable to control the above-mentioned signals such that the injection of the reactive gas by the reactive gas injection valve 26 starts after the start of the injection of the argon gas by the gas injection valve 22. It is because the metal particles as the reaction partner of the reactive gas are sputtered from the target 12 after a predetermined delay from the injection start of the argon gas.

The mode for arranging the reactive gas injection valve 26 may be similar to that of the gas injection valve 22 of the second embodiment or the third embodiment. Moreover, the reactive gas injection valve 26 may be arranged outside the chamber 11, and a reactive gas injection pipe similar to the gas injection pipe 25 of the fourth to sixth embodiment may be arranged. The reactive gas injection valve pulse power supply 29 may perform control similar to the control of the seventh embodiment (refer to FIG. 9).

Ninth Embodiment

Figure 11A:
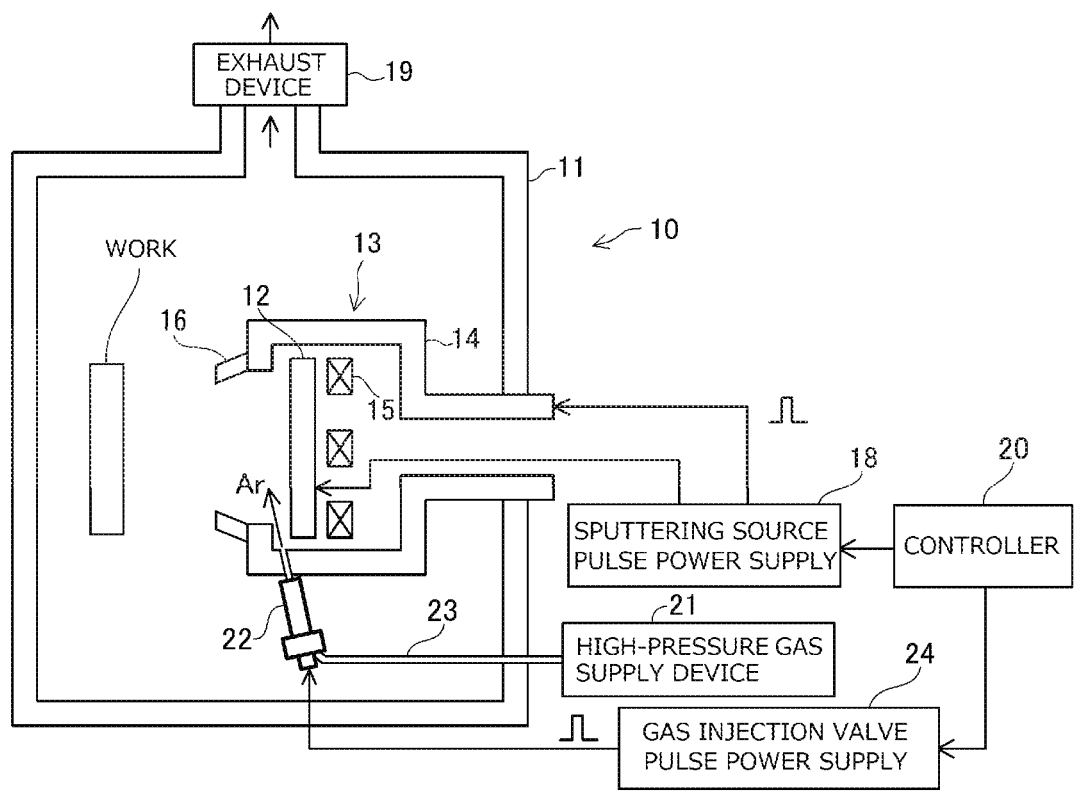
FIG. 11A is a diagram illustrating an outline of a pulse sputtering device according to a ninth embodiment of the present invention.
Figure 11B:
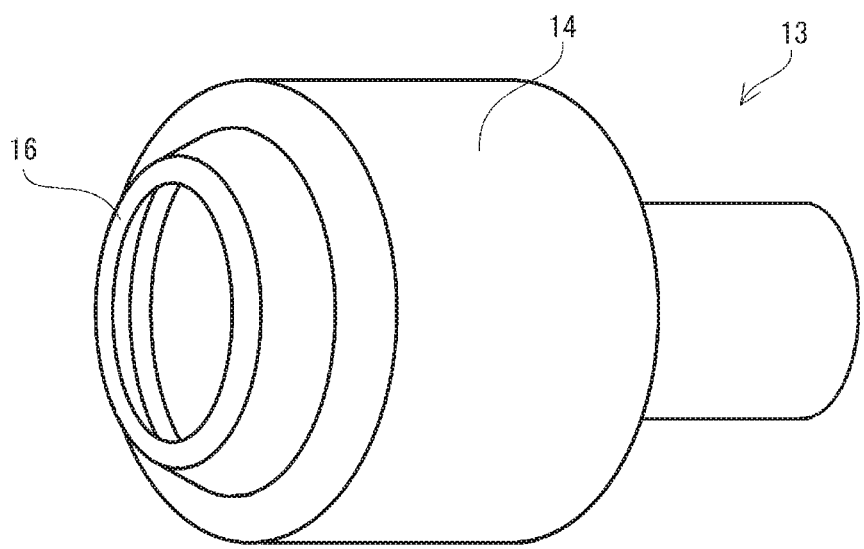
FIG. 11B is a perspective diagram showing a sputtering source of the pulse sputtering device according to the ninth embodiment.

Hereinafter, a pulse sputtering device 10 according to a ninth embodiment of the present invention will be explained with reference to FIGS. 11A and 11B. As shown in FIGS. 11A and 11B, the sputtering source 13 of this embodiment has a baffle 16 provided on the tip side (i.e., sputtering side) of the anode 14. The baffle 16 extends from the periphery of the opening of the anode 14 and is formed in a tapered cylindrical shape, which narrows gradually toward its tip. The argon gas from the gas injection valve 22 is injected from the space between the target 12 and the anode 14, and the injected gas stream collides with the baffle 16. With such the construction, the argon gas injected from the space between the target 12 and the anode 14 is bounced by an inner peripheral surface of the baffle 16 toward the sputtering surface of the target 12. Thus, the argon gas injected from the gas injection valve 22 stays near the sputtering surface of the target 12 at high concentration, whereby the efficiency of use of the argon gas improves.

Such the baffle 16 should be preferably arranged when the gas injection valve 22 is arranged as in the second embodiment or the third embodiment or when the gas injection pipe 25 is provided as in the fifth embodiment or the sixth embodiment described above.

The shape of the baffle 16 is not limited to the cylindrical shape having the tapered tip. For instance, also a baffle 16 having a cylindrical shape with a constant inner diameter can exert a certain degree of effect. It is also effective to form the inner peripheral surface of the baffle 16 as a concave curved surface.

In the above-mentioned embodiments, the pulse discharge period is included in the injection period of the inert gas, but the present invention is not limited thereto. Alternatively, a part of the pulse discharge period may be overlapped with a part of the injection period of the inert gas. Alternatively, the pulse discharge period may be started within a predetermined period after the end of the injection period of the inert gas. Also in these cases, the effect of reducing the supply quantity of the inert gas can be exerted.

In each of the above-mentioned embodiments, a negative potential may be applied to the work in order to improve the deposition of the metal to the work. In addition, a reactive gas such nitrogen or oxygen may be mixed to the inert gas.

In the explanation of the above-mentioned embodiments, the sputtering signal generator 181 is a component of the sputtering source pulse power supply 18, but the present invention is not limited thereto. Alternatively, the sputtering signal generator 181 may be an independent device or a component of the control device 20. The same can be said for the injection signal generator 241.

In the above embodiments, the delay generator 202 sends the delay signals to the sputtering signal generator 181 and the injection signal generator 241 respectively, but the present invention is not limited thereto. For instance, the injection signal generator 241 may send the delay signal to the sputtering signal generator 181. Also the reactive gas injection valve pulse power supply 29 of the eighth embodiment may receive the delay signal from the injection signal generator 241. In this way, any construction capable of performing the control illustrated as an example in FIG. 3 or 9 may be used as the construction of the control system.

Any combination of the embodiments may be implemented as long as it is operable in addition to the above mentioned combinations.

(Modifications)

The control method of the pulse sputtering device 10 according to each of the above embodiments is not limited to the control that the entire period s3 to s4, in which the pulse discharge actually occurs, is included in the period t3 to t4, in which the argon gas is actually injected. For instance, as shown in FIG. 12, the sputtering source 13 and the gas injection valve 22 may be controlled such that a part of the period s3 to s4, in which the pulse discharge occurs in the sputtering source 13, overlaps with a part of the period t3 to t4, in which the argon gas is injected and supplied by the gas injection valve 22.

Figure 12A:
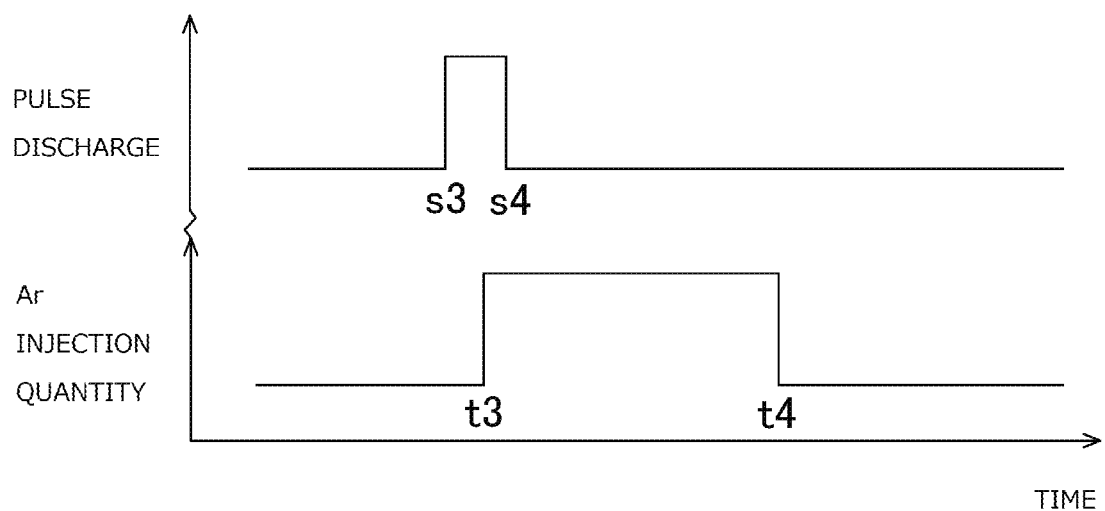
FIGS. 12A and 12B are diagrams illustrating control methods of a pulse sputtering device according to a plurality of modified examples of the present invention.

In a modification example shown in FIG. 12A, start timing s3 and end timing s4 of the period s3 to s4, in which the pulse discharge actually occurs, are earlier than start timing t3 and end timing t4 of the period t3 to t4, in which the argon gas is actually injected, respectively, and an ending part of the period s3 to s4 overlaps with a starting part of the period t3 to t4. With such the construction, the plasma can be generated by using the injection start of the argon gas as a trigger of the generation of the plasma.

Figure 12B:
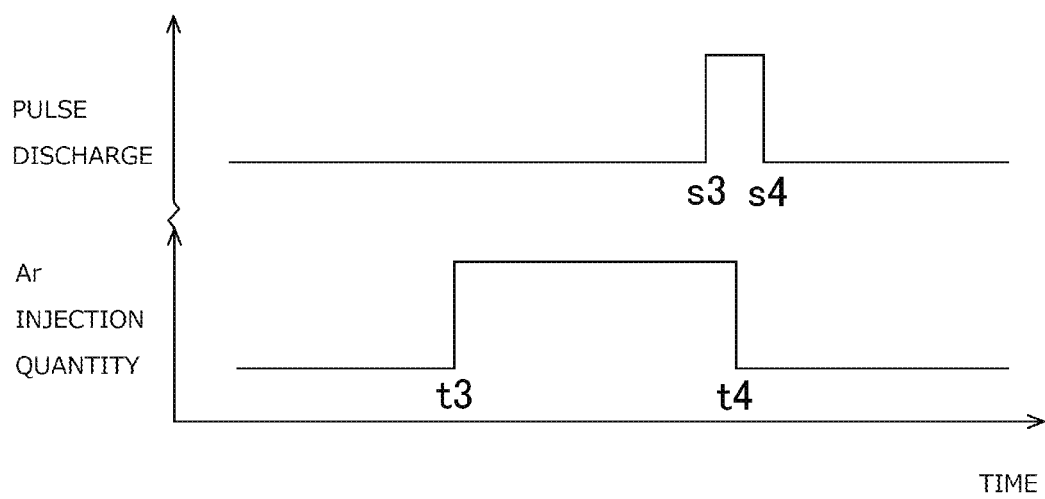

In a modification example shown in FIG. 12B, start timing s3 and end timing s4 of the period s3 to s4, in which the pulse discharge actually occurs, are later than start timing t3 and end timing t4 of the period t3 to t4, in which the argon gas is actually injected, respectively, and a starting part of the period s3 to s4 overlaps with an ending part of the period t3 to t4. With such the construction, while the sputtering continues with the argon gas remaining near the sputtering surface even after the injection of the argon gas ends, the sputtering can be maintained because self-sputtering is caused by sputtered metal atoms and ions.

The present invention is not limited to the above explanation of the aspects and the embodiments at all. The present invention also includes various modifications, which a person skilled in the art can easily conceive of without departing from the scope of the description of appended claims.

EXPLANATION OF REFERENCE NUMERALS

10 Pulse sputtering device
11 Chamber
12 Target
13 Sputtering source
14 Anode
15 Magnet unit
16 Baffle
18 Sputtering source pulse power supply
19 Exhaust device
20 Control device
21 High-pressure gas supply device
22 Gas injection valve
23 Gas supply pipe
24 Gas injection valve pulse power supply
25 Gas injection pipe
26 Reactive gas injection valve
27 Reactive gas supply device
28 Reactive gas supply pipe
29 Reactive gas injection valve pulse power supply
181 Sputtering signal generator
182 Sputtering source power supply main unit
201 Pulse generator
202 Delay generator
211 Argon gas tank
212 Pressure regulator
241 Injection signal generator
242 Gas injection valve power supply main unit

The invention claimed is:

1. A method for pulsed sputtering by using a pulsed sputtering device comprising a vacuum vessel, a sputtering source operatively connected to a sputtering source pulse power supply that performs a pulsed discharge and generates plasma, a gas injection valve operatively connected to a gas injection valve pulse power supply that is configured to inject and supply an inert gas to the sputtering source intermittently and in a pulsed fashion, and a controller that is configured to control the sputtering source and the gas injection valve, the method comprising:
generating, at the gas injection valve pulse power supply, a signal group comprising multiple micro pulse signals, which signal group is configured an injection signal;
generating, at the sputtering source pulse power supply, a pulsed electric signal consisting of a single pulse signal, said pulsed electric signal configured as a sputtering signal;
controlling the gas injection valve by causing the controller to supply power from the gas injection valve pulse power supply according to the injection signal received by the gas injection valve pulse power supply, thereby causing the gas injection valve to inject the inert gas in the pulsed fashion;
varying a quantity of the inert gas, injected to the sputtering source per unit time, by controlling a frequency of the micro pulse signals of said signal group;
controlling the sputtering source by causing the controller to supply power from the sputtering source pulse power supply according to the sputtering signal received by the sputtering source pulse power supply, thereby causing the sputtering source to generate the pulsed discharge during a discharge period; and
jointly controlling the sputtering source and the gas injection valve by operating the controller such that at least part of the discharge period during which the pulsed discharge occurs in the sputtering source overlaps with at least part of an injection period during which the gas injection valve injects and supplies the inert gas in the pulsed fashion.

2. The method according to claim 1, comprising:
causing a first frequency of the micro pulse signals during a first portion of the injection period, differ from a second frequency, of the micro pulse signals during a second portion of the injection period that follows said first portion
to vary said quantity of the inert gas, injected in the pulsed fashion to the sputtering source per unit time, between the first portion and the second portion.

3. The method according to claim 2, wherein the injection signal has a duration in a range between 200 microseconds and 1 millisecond, and
wherein a pulse width of each of the multiple micro pulse signals of the injection signal is approximately 10 microseconds.

4. The method according to claim 1, wherein said jointly controlling the sputtering source and the gas injection valve includes:
    causing the controller to deliver a signal to the sputtering source pulse power supply starting at a first time; and
    causing the controller to deliver the injection signal to the gas injection valve starting at a second time after the first time.

5. The method according to claim 1, wherein said jointly controlling the sputtering source and the gas injection valve includes:
    causing the controller to deliver the injection signal to the gas injection valve starting at a first time; and
    causing the controller to deliver a signal to the sputtering source pulse power supply starting at a second time after the first time.

\* \* \* \* \*